(12) United States Patent
Dutta

(10) Patent No.: US 10,367,487 B1
(45) Date of Patent: Jul. 30, 2019

(54) QUADRATURE CLOCK DIVIDER WITH 25%/75% DUTY CYCLE

(71) Applicant: Marvell International Ltd., Hamilton (BM)

(72) Inventor: Ramen Dutta, Prilly (CH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/932,298

(22) Filed: Feb. 16, 2018

Related U.S. Application Data

(60) Provisional application No. 62/460,564, filed on Feb. 17, 2017.

(51) Int. Cl.

| | |
|---|---|
| H03K 3/017 | (2006.01) |
| H03K 5/08 | (2006.01) |
| H03K 3/356 | (2006.01) |
| H03K 5/00 | (2006.01) |
| H04B 1/40 | (2015.01) |

(52) U.S. Cl.
CPC ............. *H03K 5/08* (2013.01); *H03K 3/017* (2013.01); *H03K 3/356104* (2013.01); *H03K 2005/00078* (2013.01); *H03K 2005/00286* (2013.01); *H04B 1/40* (2013.01)

(58) Field of Classification Search
CPC .................................. H03K 7/08; H03K 5/04
See application file for complete search history.

(56) References Cited

U.S. PATENT DOCUMENTS

| | | | | |
|---|---|---|---|---|
| 7,005,900 B1 * | 2/2006 | Nguyen | ................ | G06F 7/68 327/116 |
| 7,545,191 B2 * | 6/2009 | Austin | ................ | H03K 5/04 327/175 |
| 2015/0229311 A1 * | 8/2015 | Zhang | ................ | H03K 21/02 327/117 |

OTHER PUBLICATIONS

Andrews, C., et al., "A Passive Mixer-First Receiver With Digitally Controlled and Widely Tunable RF Interface," *IEEE Journal of Solid-State Circuits*, vol. 45, No. 12, Dec. 2010, pp. 1-13.

Fabiano, I., et al., "SAW-Less Analog Front-End Receivers for TDD and FDD," *IEEE Journal of Solid-State Circuits*, vol. 48, No. 12, Dec. 2013, pp. 3067-3079.

Ghaffari, A., et al., "Tunable High-Q N-Path Band-Pass Filters: Modeling and Verification," *IEEE Journal of Solid-State Circuits*, vol. 46, No. 5, May 2011, pp. 998-1010.

(Continued)

*Primary Examiner* — Hai L Nguyen

(57) ABSTRACT

A quadrature clock divider circuit includes a divide-by-2 circuit having at least one undivided clock input, and generates at least one quadrature clock component and at least one inverted quadrature clock component, each having a 50% duty cycle. A resync circuit has as inputs the at least one undivided clock input, and the uninverted and inverted quadrature clock components. The resync circuit uses the uninverted and inverted quadrature clock components as selectors to generate, from the undivided clock input signals, at least one second quadrature clock component on a first signal path and at least one second inverted quadrature clock component on a second signal path. The first and second signal paths have a first portion in common, and each of the at least one second quadrature clock component and the at least one second inverted quadrature clock component has a second duty cycle percentage other than 50%.

20 Claims, 4 Drawing Sheets

(56) References Cited

OTHER PUBLICATIONS

Kaczman, D., et al., "A Single-Chip 10-Band WCDMA/HSDPA 4-Band GSM/EDGE SAW-less CMOS Receiver With DigRF 3G Interface and +90 dBm IIP2," *IEEE Journal of Solid-State Circuits*, vol. 44, No. 3, Mar. 2009, pp. 718-739.

Mirzaei, A., et al., "Analysis and Optimization of Direct-Conversion Receivers With 25% Duty-Cycle Current-Driven Passive Mixers," *IEEE Transactions on Circuits and Systems—I: Regular Papers*, vol. 57, No. 9, Sep. 2010, pp. 2353-2366.

Razavi, B., et al., "Design of High-Speed, Low-Power Frequency Dividers and Phase-Locked Loops in Deep Submicron CMOS," *IEEE Journal of Solid-State Circuits*, vol. 30, No. 2, Feb. 1995, pp. 101-109.

\* cited by examiner

QUADRATURE CLOCK DIVIDER WITH 25%/75% DUTY CYCLE

CROSS REFERENCE TO RELATED APPLICATION

This claims the benefit of commonly-assigned United States Provisional Patent Application No. 62/460,564, filed Feb. 17, 2017, which is hereby incorporated by reference herein in its entirety.

FIELD OF USE

This disclosure relates to a 25%-duty-cycle quadrature clock divider with improved power, phase mismatch, and noise characteristics.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Some clocked systems use, instead of a single clock signal, a quadrature clock having an in-phase ("I") clock path and a quadrature-phase ("Q") clock path. The signal on the Q-path is 90° out of phase with the signal on the I-path. In some differential architectures, there may be four clock paths, including not only an I-path and a Q-path, but also an inverted I-path, referred to as "Ī" ("I-bar" or "IB"), and an inverted Q-path, referred to as "Q̄" ("Q-bar" or "QB").

Quadrature clocks may be used, for example, in certain transceivers for image rejection in direct conversion and low-IF architectures.

One way to generate quadrature clocks is to generate a clock signal with twice the desired frequency (using, e.g., a phase-locked loop), and then to pass that signal through a divide-by-2 circuit, which results in the two quadrature components ("I" and "Q") at the correct frequency, each having a 50% duty cycle. Passing the inverted clock through the divider as well will also result in the two inverted quadrature components (IB and QB), again each having a 50% duty cycle.

For some applications, a 25% duty cycle may be preferred. However, previously known techniques for generating 25%-duty-cycle quadrature clock components often result in noise, as well as phase mismatch among the quadrature components.

SUMMARY

A quadrature clock divider circuit according to the subject matter of this disclosure includes a divide-by-2 circuit having at least one undivided clock input signal, the divide-by-2 circuit generating, from the at least one undivided clock input signal, at least one quadrature clock component and at least one inverted quadrature clock component. Each of the at least one quadrature clock component and the at least one inverted quadrature clock component has a 50% duty cycle. A resync circuit has as inputs the at least one undivided clock input signal, the at least one quadrature clock component and the at least one inverted quadrature clock component. The resync circuit uses the at least one quadrature clock component and the at least one inverted quadrature clock component as selectors to generate, from the at least one undivided clock input signal, at least one second quadrature clock component on a first signal path and at least one second inverted quadrature clock component on a second signal path. The first signal path and the second signal path have a first portion in common, and each of the at least one second quadrature clock component and the at least one second inverted quadrature clock component has a second duty cycle percentage other than 50%.

In a first implementation of such a quadrature clock divider circuit, the at least one undivided clock input signal that is input to the divide-by-2 circuit includes an undivided clock and an inverted undivided clock, and the at least one quadrature clock component and the at least one inverted quadrature clock component generated by the divide-by-2 circuit include a first in-phase quadrature clock component, a first inverted in-phase quadrature clock component, a first quadrature-phase quadrature clock component and a first inverted quadrature-phase quadrature clock component. each of the first in-phase quadrature clock component, the first inverted in-phase quadrature clock component, the first quadrature-phase quadrature clock component and the first inverted quadrature-phase quadrature clock component has a 50% duty cycle. The resync circuit has as inputs the undivided clock, the inverted undivided clock, the first in-phase quadrature clock component, the first inverted in-phase quadrature clock component, the first quadrature-phase quadrature clock component and the first inverted quadrature-phase quadrature clock component. The resync circuit generates, from the undivided clock and one of (a) the first quadrature-phase quadrature clock component and the first inverted quadrature-phase quadrature clock component, and (b) the first in-phase quadrature clock component and the first inverted in-phase quadrature clock component, a third quadrature clock component on the first signal path and a third inverted quadrature clock component on the second signal path. The resync circuit further generates, from the inverted undivided clock and one of (a) the first in-phase quadrature clock component and the first inverted in-phase quadrature clock component, and (b) the first quadrature-phase quadrature clock component and the first inverted quadrature-phase quadrature clock component, a fourth quadrature clock component on a third signal path and a fourth inverted quadrature clock component on a fourth signal path. The third signal path and the fourth signal path have a first portion in common, and each of the third quadrature clock component, the third inverted quadrature clock component, the fourth quadrature clock component and the fourth inverted quadrature clock has a second duty cycle percentage other than 50%.

In a first variant of such an implementation of a quadrature clock divider circuit, the first signal path may be coupled to the second signal path, and the third signal path may be coupled to the fourth signal path.

In such a variant, the first signal path may include, a first plurality of transistors, the second signal path may include a second plurality of transistors, a first transistor is common to the first signal path and the second signal path, the third signal path may include a third plurality of transistors, the fourth signal path may include a fourth plurality of transistors, and a second transistor is common to the third signal path and the fourth signal path.

In that variant, a respective transistor in the first signal path and a respective transistor in the second signal path may share a first common gate input, and a respective transistor in the third signal path and a respective transistor in the fourth signal path may share a second common gate input.

In that variant, the first common gate input may also be a gate input to the first transistor, and the second common gate input may also be a gate input to the second transistor. The first common gate input may be the undivided clock, and the second common gate input may be the inverted undivided clock.

The first transistor and the second transistor may both be of a first channel type, and all four of the respective transistor in the first signal path and the respective transistor in the second signal path that share the first common gate input, and the respective transistor in the third signal path and the respective transistor in the fourth signal path that share a second common gate input, may be of a second channel type different from the first channel type, each respective transistor having a respective source and a respective drain. The quadrature clock divider circuit may further include a first input transistor in the first signal path gated by the first quadrature-phase quadrature clock component, a second input transistor in the second signal path gated by the inverted first quadrature-phase quadrature clock component, a third input transistor in the third signal path gated by the first in-phase quadrature clock component, and a fourth input transistor in the fourth signal path gated by the inverted first in-phase quadrature clock component. Each of the first input transistor, the second input transistor, the third input transistor and the fourth input transistor may be of the first channel type.

In such a quadrature clock divider circuit, the first channel type may be p-channel, the second channel type may be n-channel, each of the first transistor and the second transistor may have a respective source coupled to a respective supply of voltage, and may have a respective drain. The first input transistor may have a source coupled to the drain of the first transistor, and may have a first drain. The second input transistor may have a source coupled to the drain of the first transistor, and may have a second drain. The first drain may be coupled to the source of the respective transistor in the first signal path, and the second drain may be coupled to the source of the respective transistor in the second signal path. The third input transistor may have a third drain that is coupled to the source of the respective transistor in the third signal path, and the fourth input transistor may have a fourth drain that is coupled to the source of the respective transistor in the fourth signal path. The respective drains of the respective transistors in the first, second, third and fourth signal paths may be coupled to ground, and the second duty-cycle percentage is 25%.

In such a quadrature clock divider circuit, the first channel type may be n-channel, and the second channel type may be p-channel. Each of the first transistor and the second transistor may have a respective drain coupled to ground, and may have a respective source. The first input transistor may have a drain coupled to the source of the first transistor, and may have a first source. The second input transistor may have a drain coupled to the source of the first transistor, and may have a second source. The first source may be coupled to the drain of the respective transistor in the first signal path, and the second source may be coupled to the drain of the respective transistor in the second signal path. The third input transistor may have third source that is coupled to the drain of the respective transistor in the third signal path. The fourth input transistor may have a fourth source that is coupled to the drain of the respective transistor in the fourth signal path. The respective sources of the respective transistors in the first, second, third and fourth signal paths are coupled to a supply of voltage, and the second duty-cycle percentage is 75%.

Another variant of the first implementation may further include a respective time delay, between the divide-by-2 circuit and the resync circuit, on each of the first in-phase clock, the first inverted in-phase clock, the first quadrature clock and the first inverted quadrature clock to prevent edges of the first in-phase quadrature clock component, the first inverted in-phase quadrature clock component, the first quadrature-phase quadrature clock component and the first inverted quadrature-phase quadrature clock component from arriving simultaneously with edges of the undivided clock and the inverted undivided clock. In that variant, each respective time delay may be configured to have a delay value of up to one-quarter of a clock period.

A method according to implementations of the subject matter of this disclosure, for generating an output quadrature-phase quadrature clock component, an output inverted quadrature-phase quadrature clock component, an output in-phase quadrature clock component and an output inverted in-phase quadrature clock component, from an undivided clock and an inverted undivided clock, includes dividing, by 2, the undivided clock and the inverted undivided clock, to generate a first in-phase quadrature clock component, a first inverted in-phase quadrature clock component, a first quadrature-phase quadrature clock component and a first inverted quadrature-phase quadrature clock component, wherein each of the first in-phase quadrature clock component, the first inverted in-phase quadrature clock component, the first quadrature-phase quadrature clock component and the first inverted quadrature-phase quadrature clock component has a 50% duty cycle. The first in-phase quadrature clock component, the first inverted in-phase quadrature clock component, the first quadrature-phase quadrature clock component and the first inverted quadrature-phase quadrature clock component, are used as respective selectors to select the output quadrature-phase quadrature clock component, the output inverted quadrature-phase quadrature clock component, the output in-phase quadrature clock component and the output inverted in-phase quadrature clock component, from the undivided clock and the inverted undivided clock on separate signal paths having a portion in common.

In a first implementation of such a method, using the first in-phase quadrature clock component, the first inverted in-phase quadrature clock component, the first quadrature-phase quadrature clock component and the first inverted quadrature-phase quadrature clock component, as respective selectors to select the output quadrature-phase quadrature clock component, the output inverted quadrature-phase quadrature clock component, the output in-phase quadrature clock component and the output inverted in-phase quadrature clock component, from the undivided clock and the inverted undivided clock, includes resyncing the undivided clock with one of (a) the first quadrature-phase quadrature clock component and the first inverted quadrature-phase quadrature clock component, and (b) the first in-phase quadrature clock component and the first inverted in-phase quadrature clock component, to generate one of (1) the output in-phase quadrature clock component and the output inverted in-phase quadrature clock component, and (2) the output quadrature-phase quadrature clock component and the output inverted quadrature-phase quadrature clock component, and also includes resyncing the inverted undivided clock with one of (c) the first in-phase quadrature clock component and the first inverted in-phase quadrature clock component, and (d) the first quadrature-phase quadrature clock component and the first inverted quadrature-phase quadrature clock component, to generate one of (3) the output quadrature-phase quadrature clock component and the output inverted quadrature-phase quadrature clock component, and (4) the output in-phase quadrature clock component and the output inverted in-phase quadrature clock component. Each of the output quadrature-phase quadrature clock component, the output inverted quadrature-phase quadrature clock component, the output in-phase quadrature clock component and the output inverted in-phase quadrature clock component has a second duty cycle percentage other than 50%.

Such an implementation further includes, after the dividing and before the resyncings, delaying the first in-phase quadrature clock component, the first inverted in-phase quadrature clock component, the first quadrature-phase quadrature clock component and the first inverted quadrature-phase quadrature clock component, to prevent edges of the first in-phase quadrature clock component, the first inverted in-phase quadrature clock component, the first quadrature-phase quadrature clock component and the first inverted quadrature-phase quadrature clock component from arriving simultaneously with edges of the undivided clock and the inverted undivided clock. The delaying may include delaying by up to one-quarter of a clock period.

In such an implementation, each of the output quadrature-phase quadrature clock component, the output inverted quadrature-phase quadrature clock component, the output in-phase quadrature clock component and the output inverted in-phase quadrature clock component may be generated on its own respective signal path. Each of the respective resyncings may include, respectively, coupling the signal path on which the output quadrature-phase quadrature clock component is generated to the signal path on which the output inverted quadrature-phase quadrature clock component is generated, and coupling the signal path on which the output in-phase quadrature clock component is generated to the signal path on which the output inverted in-phase quadrature clock component is generated.

In such an implementation, each of the respective resyncings may include, respectively, generating the output quadrature-phase quadrature clock component and the output inverted quadrature-phase quadrature clock component having a second duty cycle of 25%, and generating the output in-phase quadrature clock component and the output inverted in-phase quadrature clock component having a second duty cycle of 25%.

In such an implementation, each of the respective resyncings may include, respectively, generating the output quadrature-phase quadrature clock component and the output inverted quadrature-phase quadrature clock component having a second duty cycle of 75%, and generating the output in-phase quadrature clock component and the output inverted in-phase quadrature clock component having a second duty cycle of 75%.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
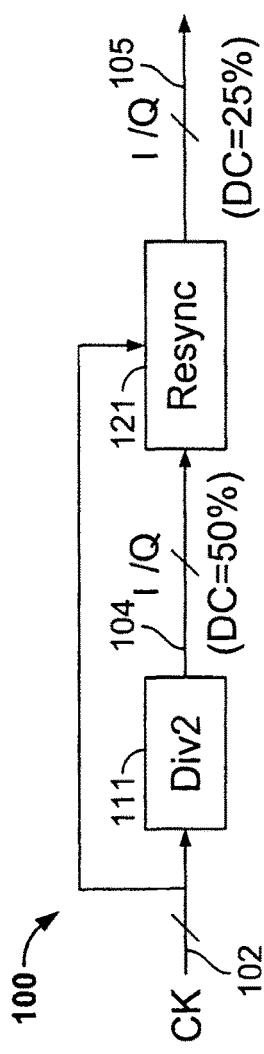
FIG. 1 is a schematic overview of an implementation of the subject matter of this disclosure for generating a 25%-duty-cycled quadrature clock.

As noted above, one way to generate quadrature clock components is to generate a clock signal with twice the desired frequency (using, e.g., a phase-locked loop), and then to pass that signal through a divide-by-2 circuit, which results in the two quadrature components (I and Q) at the correct frequency, each having a 50% duty cycle. Passing the inverted clock through the divider as well will also result in the two inverted quadrature components (IB and QB), again each having a 50% duty cycle. However, for some applications, a 25% duty cycle or 75% duty cycle may be preferred.

For example, quadrature clocks may be used in certain transceivers for image rejection in direct conversion and low-IF architectures. An input signal to be demodulated may be separately mixed with both in-phase (I) and quadrature-phase (Q) clock components to provide I-path and Q-path signals to be demodulated. A passive mixer is often used because passive mixers exhibit higher linearity, lower flicker noise, and lower power consumption, than active mixers.

For a passive mixer, a 25% non-overlapping duty-cycled clock has advantages over a 50%-duty-cycled clock, including better gain (by about 3 dB), lower noise (again by about 3 dB), lower sensitivity to 1/f noise and IM products, and minimized I/Q cross talk. A 25% duty-cycled clock also can be used with active mixers, although doing so may not necessarily present the same advantages as with passive mixers.

There are various previously-known techniques for generating 25%-duty-cycled quadrature clock components. In general, those techniques involve generating the 50%-duty-cycled quadrature clock components (I, IB, Q, QB) using, e.g., a divide-by-2 circuit as described above, and then combining those 50%-duty-cycled components using various combinations of gates or latches. However, those known techniques suffer to varying degrees from phase mismatch and noise, as well as increased power consumption.

In one known technique, the four 50%-duty-cycled quadrature clock components (I, IB, Q, QB) are "resynced" with the undivided clock ("CLK") and the inverted undivided clock ("CLKB") using AND or NAND gates (in one implementation, both I and IB are ANDed with CLKB, while both Q and QB are ANDed with CLK). While this known resyncing technique has improved performance compared to earlier techniques, it still suffers from some mismatch, as well as increased power consumption resulting from increased clock loading.

Another known technique resyncs the quadrature components by ANDing them together, and then passing them through a shift register chain that is clocked by the undivided clock. While this known resyncing technique also has improved performance compared to earlier techniques, it suffers from some mismatch and noise. In addition, the input frequency in this case is four times the required output frequency and the divider is dividing by 4, which increases power consumption.

In accordance with implementations of the subject matter of this disclosure, 25%-duty-cycled quadrature clock components are generating using a resyncing technique in which, for each path (I/IB and Q/QB), the uninverted and inverted signal pairs are generated on coupled circuit paths—i.e., the circuit path that generates the uninverted in-phase 25%-duty-cycled quadrature clock signal, and the circuit path that generates the inverted in-phase 25%-duty-cycled quadrature clock signal, have a portion in common, and similarly, the circuit path that generates the uninverted quadrature-phase 25%-duty-cycled quadrature clock signal, and the circuit path that generates the inverted quadrature-phase 25%-duty-cycled quadrature clock signal, have a portion in common.

As used herein and in the claims which follow, "portion in common" may refer to a circuit element or component (such as a transistor).

Figure 2:
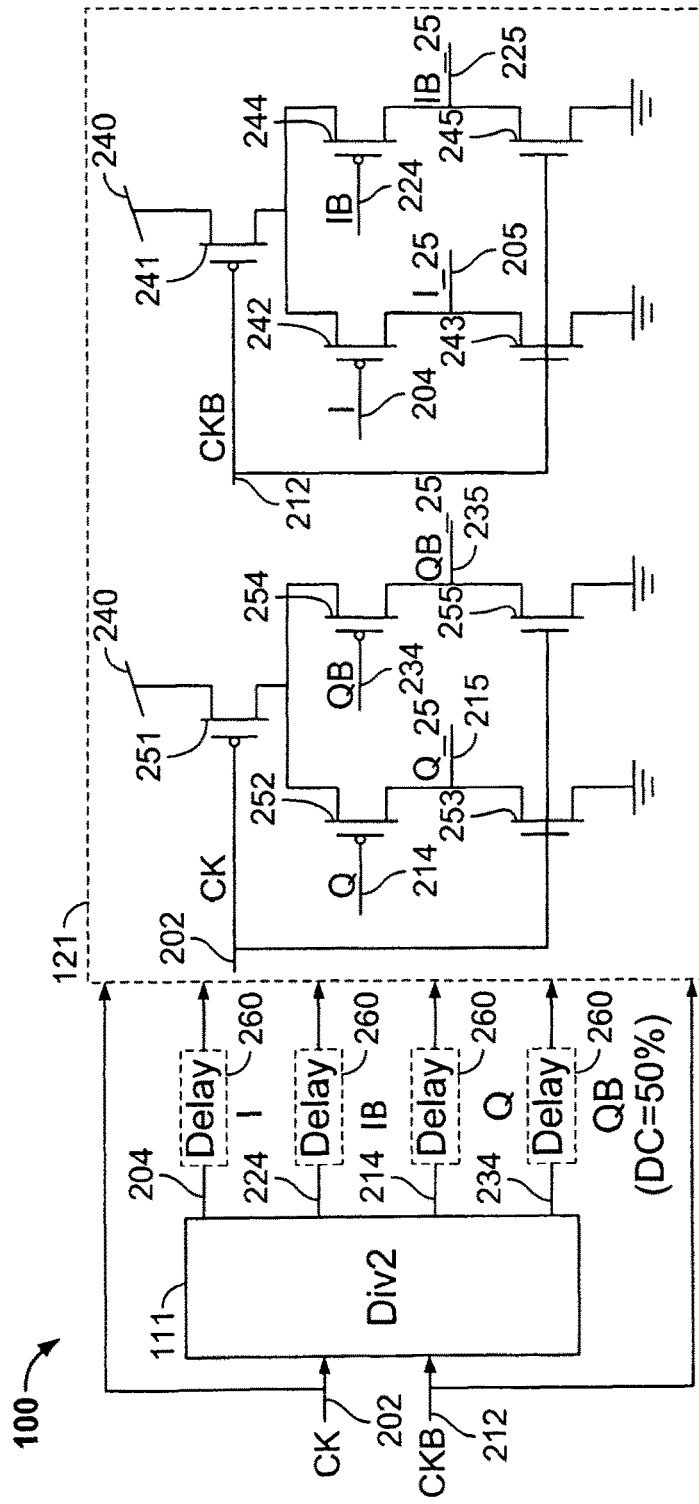
FIG. 2 is a schematic diagram of a detailed version of the implementation of FIG. 1.

FIG. 1 shows an overview of an implementation of the subject matter of this disclosure for generating a 25%-duty-cycled quadrature clock, while FIG. 2 shows a detailed version of the implementation of FIG. 1.

Circuit 101 of FIG. 1 includes divide-by-2 circuit 111 and resync circuit 121. In this implementation, clock input 102 may include both undivided clock input signal 202 and inverted undivided clock input signal (CKB) 212 (FIG. 2). While clock input signals 202, 212 are referred to in this description, and in the claims which follow, as "undivided," that characterization refers only to the state of clock input signals 202, 212 relative to downstream signals in circuits according to implementations of the subject matter of this disclosure, and is not meant to foreclose the possibility that any input signal to circuitry according to the subject matter of this disclosure could have been generated by division upstream of such circuitry.

Divide-by-2 circuit 111 outputs quadrature clock signals 104, which may include both in-phase quadrature clock signal (I) 204 and quadrature-phase quadrature clock signal (Q) 214 as well as both inverted in-phase quadrature clock signal (IB) 224 and inverted quadrature-phase quadrature clock signal (QB) 234 (FIG. 2). Quadrature clock signals 104 have a 50% duty cycle.

Resync circuit 121 uses the quadrature clock signals 104 as selectors to select output quadrature clock components from the undivided clock 202 and the inverted undivided clock 212 and outputs 25%-duty-cycled quadrature clock components 105, including both 25%-duty-cycled in-phase quadrature clock signal (I_25) 205 and 25%-duty-cycled quadrature-phase quadrature clock signal (Q_25) 215 as well as both 25%-duty-cycled inverted in-phase quadrature clock signal (IB_25) 225 and 25%-duty-cycled inverted quadrature-phase quadrature clock signal (QB_25) 235 (FIG. 2). The nature of the logic in resync circuit 121 is such that the outputs are triggered by input undivided clock edges, by assuring that the edges of input undivided clock signals 202, 212, which trigger the outputs, arrive after the desired edge of the divided clock signals 104 to be resynced.

As can be seen in FIG. 2, 25%-duty-cycled in-phase quadrature clock signal (I_25) 205 is generated on a signal path including p-channel transistor 241 coupled to source 240 of supply voltage, as well as p-channel transistor 242 and n-channel transistor 243. p-channel transistor 242 may be considered the input transistor for its signal path, insofar as it is gated by 50%-duty-cycled quadrature-phase quadrature clock signal (Q) 204.

25%-duty-cycled inverted in-phase quadrature clock signal (IB_25) 225 is generated on a signal path including p-channel transistor 241 as well as p-channel transistor 244 and n-channel transistor 245. p-channel transistor 244 may be considered the input transistor for its signal path, insofar as it is gated by 50%-duty-cycled inverted quadrature-phase quadrature clock signal (QB) 224.

Thus, the two signal paths that generate 25%-duty-cycled in-phase quadrature clock signal (I_25) 205 and 25%-duty-cycled inverted in-phase quadrature clock signal (IB_25) 225 have transistor 241 in common. In addition, transistors 243 and 245, whose drains are coupled to ground, have a gate voltage in common, and that gate voltage also is the same gate voltage that controls transistor 241. In the implementation shown in FIG. 2, that common gate voltage is inverted undivided clock input signal (CKB) 212.

These commonalities between the two signal paths that generate 25%-duty-cycled in-phase quadrature clock signal (I_25) 205 and 25%-duty-cycled inverted in-phase quadrature clock signal (IB_25) reduce phase mismatch between 25%-duty-cycled in-phase quadrature clock signal (I_25) 205 and 25%-duty-cycled inverted in-phase quadrature clock signal (IB_25) 225. Sharing a component also reduces parasitic capacitance. And because this circuitry can eliminate the need for some input components, parasitic capacitance is reduced even further, using this circuitry. The reduction in parasitic capacitance causes clock edges to rise and fall faster, reducing jitter caused by noise, and reducing phase error caused by device mismatch. In addition, power consumption is reduced as compared to some of the known techniques described above, because, e.g., of the absence of increased clock loading or shift registers.

The signal paths that generate 25%-duty-cycled quadrature-phase quadrature clock signal (Q_25) 215 and 25%-duty-cycled inverted quadrature-phase quadrature clock signal (QB_25) 235 are similar. 25%-duty-cycled quadrature-phase quadrature clock signal (Q_25) 215 is generated on a signal path including p-channel transistor 251 coupled to source 240 of supply voltage, as well as p-channel transistor 252 and n-channel transistor 253. p-channel transistor 252 may be considered the input transistor for its signal path, insofar as it is gated by 50%-duty-cycled inverted in-phase quadrature clock signal (IB) 214.

25%-duty-cycled inverted quadrature-phase quadrature clock signal (QB_25) 235 is generated on a signal path including p-channel transistor 251 as well as p-channel transistor 254 and n-channel transistor 255. p-channel transistor 254 may be considered the input transistor for its signal path, insofar as it is gated by 50%-duty-cycled in-phase quadrature clock signal (I) 234.

Thus, the two signal paths that generate 25%-duty-cycled quadrature-phase quadrature clock signal (Q_25) 215 and 25%-duty-cycled inverted quadrature-phase quadrature clock signal (QB_25) 225 have transistor 251 in common. In addition, transistors 253 and 255, whose drains are coupled to ground, have a gate voltage in common, and that gate voltage also is the same gate voltage that controls transistor 251. In the implementation shown in FIG. 2, that common gate voltage is undivided clock input signal (CK) 202.

These commonalities between the two signal paths that generate 25%-duty-cycled quadrature-phase quadrature clock signal (Q_25) 205 and 25%-duty-cycled inverted quadrature-phase quadrature clock signal (QB_25) 225 reduce phase mismatch between 25%-duty-cycled quadrature-phase quadrature clock signal (Q_25) 215 and 25%-duty-cycled inverted quadrature-phase quadrature clock signal (QB_25) 235. Sharing a component also reduces parasitic capacitance. And because this circuitry can eliminate the need for some input components, parasitic capacitance is reduced even further using this circuitry. The reduction in parasitic capacitance causes clock edges to rise and fall faster, reducing jitter caused by noise, and reducing phase error caused by device mismatch. In addition, power consumption is reduced as compared to some of the known techniques described above, because, e.g., of the absence of increased clock loading or shift registers.

75%-duty-cycled quadrature clock signals can be generated by generating 25%-duty-cycled quadrature clock signals (e.g., as just described) and then inverting each of the 25%-duty-cycled quadrature clock components. However, adding an inverter to each individual 25%-duty-cycled quadrature clock component will again introduce phase mismatch and noise between the various quadrature components, and may increase power consumption. Also, 75%-duty-cycled clocks may be preferred where a 25%-duty-cycled clock is required but only one stage of inverters is sufficient for buffering and driving the load, so extra inverters should be avoided in such a case. Therefore, in an implementation of the subject matter of this disclosure shown in FIGS. 3 and 4, 75%-duty-cycled quadrature clock signals 305 are generated directly by circuit 300.

Figure 3:
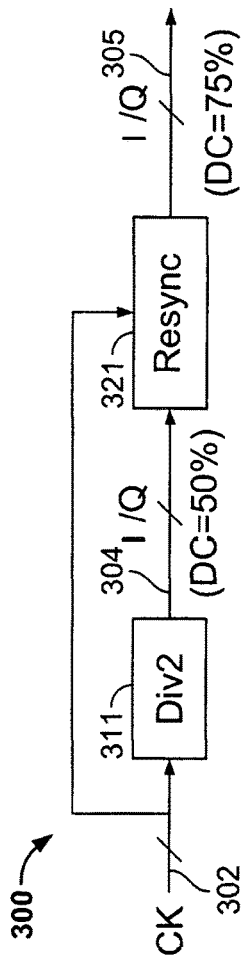
FIG. 3 is a schematic overview of an implementation of the subject matter of this disclosure for generating a 75%-duty-cycled quadrature clock.
Figure 4:
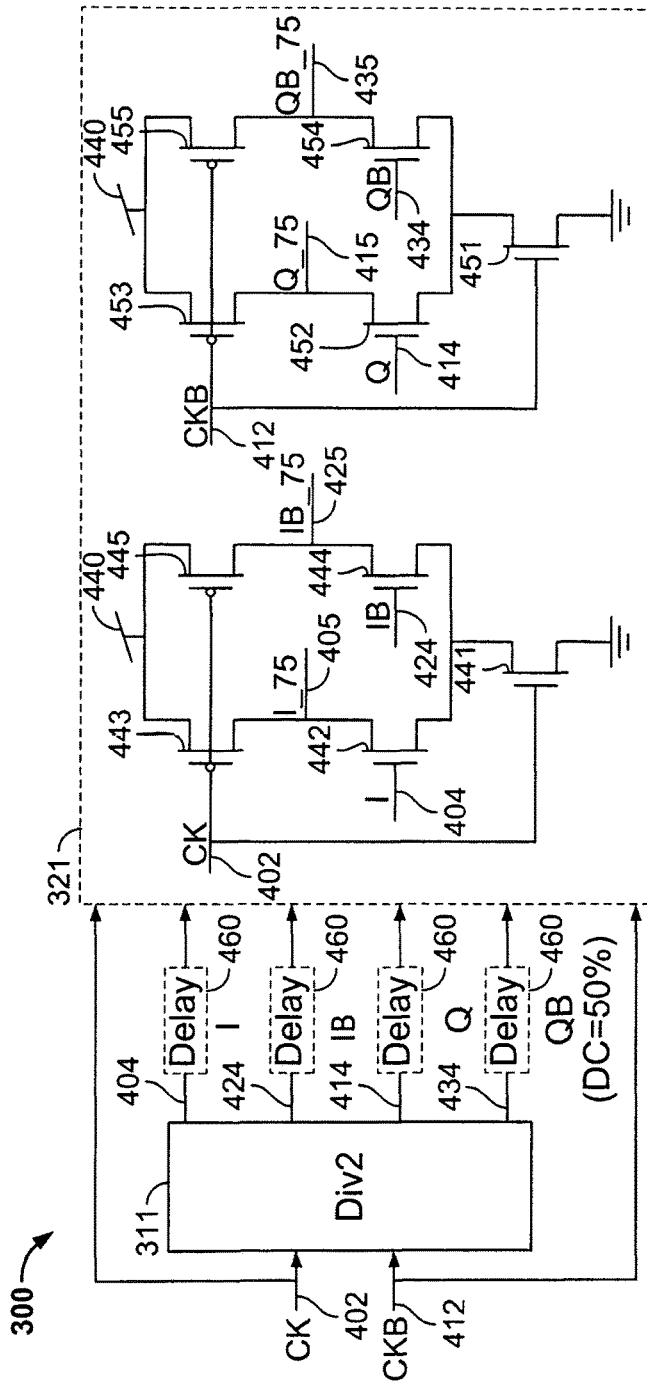
FIG. 4 is a schematic diagram of a detailed version of the implementation of FIG. 3.

FIG. 3 shows an overview of an implementation of the subject matter of this disclosure for generating a 75%-duty-cycled quadrature clock, while FIG. 4 shows a detailed version of the implementation of FIG. 3.

Circuit 300 of FIG. 3 includes divide-by-2 circuit 311 and resync circuit 321. Clock input 302 may include both undivided clock input signal (CK) 402 and inverted undivided clock input signal (CKB) 412 (FIG. 4). While clock input signals 402, 412 are referred to in this description, and in the claims which follow, as "undivided," that characterization refers only to the state of clock input signals 402, 412 relative to downstream signals in circuits according to implementations of the subject matter of this disclosure, and is not meant to foreclose the possibility that any input signal to circuitry according to the subject matter of this disclosure could have been generated by division upstream of such circuitry.

Divide-by-2 circuit 311 outputs quadrature clock signals 304, which may include both in-phase quadrature clock signal (I) 404 and quadrature-phase quadrature clock signal (Q) 414 as well as both inverted in-phase quadrature clock signal (IB) 424 and inverted quadrature-phase quadrature clock signal (QB) 434 (FIG. 4). Quadrature clock signals 304 have a 50% duty cycle.

Resync circuit 321 uses the quadrature clock signals 304 as selectors to select output quadrature clock components from the undivided clock 402 and the inverted undivided clock 412 and outputs 75%-duty-cycled quadrature clock components 305, including both 75%-duty-cycled in-phase quadrature clock signal (I_75) 405 and 75%-duty-cycled quadrature-phase quadrature clock signal (Q_75) 415 as well as both 75%-duty-cycled inverted in-phase quadrature clock signal (IB_75) 425 and 75%-duty-cycled inverted quadrature-phase quadrature clock signal (QB_75) 435 (FIG. 4). The nature of the logic in resync circuit 321 is such that the outputs are triggered by input undivided clock edges, by assuring that the edges of input undivided clock signals 402, 412, which trigger the outputs, arrive after the desired edge of the divided clock signals 304 to be resynced.

As can be seen in FIG. 4, 75%-duty-cycled in-phase quadrature clock signal (I_75) 405 is generated on a signal path including n-channel transistor 441 coupled to ground, as well as n-channel transistor 442 and p-channel transistor 443. n-channel transistor 442 may be considered the input transistor for its signal path, insofar as it is gated by 50%-duty-cycled inverted quadrature-phase quadrature clock signal (QB) 404.

75%-duty-cycled inverted in-phase quadrature clock signal (IB_75) 425 is generated on a signal path including n-channel transistor 441 as well as n-channel transistor 444 and p-channel transistor 445. n-channel transistor 444 may be considered the input transistor for its signal path, insofar as it is gated by 50%-duty-cycled quadrature-phase quadrature clock signal (Q) 424.

Thus, the two signal paths that generate 75%-duty-cycled in-phase quadrature clock signal (I_75) 405 and 75%-duty-cycled inverted in-phase quadrature clock signal (IB_75) 425 have transistor 441 in common. In addition, transistors 443 and 445, whose sources are coupled to a source 440 of supply voltage, have a gate voltage in common, and that gate voltage also is the same gate voltage that controls transistor 441. In the implementation shown in FIG. 4, that common gate voltage is undivided clock input signal (CK) 402.

These commonalities between the two signal paths that generate 75%-duty-cycled in-phase quadrature clock signal (I_75) 405 and 75%-duty-cycled inverted in-phase quadrature clock signal (IB_75) 425 reduce phase mismatch between 75%-duty-cycled in-phase quadrature clock signal (I_75) 405 and 75%-duty-cycled inverted in-phase quadrature clock signal (IB_75) 425. Sharing a component also reduces parasitic capacitance. And because this circuitry can eliminate the need for some input components, parasitic capacitance is reduced even further using this circuitry. The reduction in parasitic capacitance causes clock edges to rise and fall faster, reducing jitter caused by noise, and reducing phase error caused by device mismatch. In addition, power consumption is reduced as compared to some of the known techniques described above, because, e.g., of the absence of increased clock loading or shift registers.

The signal paths that generate 75%-duty-cycled quadrature-phase quadrature clock signal (Q_75) 415 and 75%-duty-cycled inverted quadrature-phase quadrature clock signal (QB_75) 435 are similar. 75%-duty-cycled quadrature-phase quadrature clock signal (Q_75) 415 is generated on a signal path including n-channel transistor 451 coupled to ground, as well as n-channel transistor 452 and p-channel transistor 453. n-channel transistor 452 may be considered the input transistor for its signal path, insofar as it is gated by 50%-duty-cycled in-phase quadrature clock signal (QB) 434.

75%-duty-cycled inverted quadrature-phase quadrature clock signal (QB_25) 435 is generated on a signal path including n-channel transistor 451 as well as n-channel transistor 454 and p-channel transistor 455. n-channel transistor 454 may be considered the input transistor for its signal path, insofar as it is gated by 50%-duty-cycled inverted in-phase quadrature clock signal (QB) 434.

Thus, the two signal paths that generate 75%-duty-cycled quadrature-phase quadrature clock signal (Q_75) 415 and 75%-duty-cycled inverted quadrature-phase quadrature clock signal (QB_75) 435 have transistor 451 in common. In addition, transistors 453 and 455, whose sources are coupled to source 440 of supply voltage, have a gate voltage in common, and that gate voltage also is the same gate voltage that controls transistor 451. In the implementation shown in FIG. 4, that common gate voltage is inverted undivided clock input signal (CKB) 412.

These commonalities between the two signal paths that generate 75%-duty-cycled quadrature-phase quadrature clock signal (Q_75) 415 and 75%-duty-cycled inverted quadrature-phase quadrature clock signal (QB_75) 435 reduce phase mismatch between 75%-duty-cycled quadrature-phase quadrature clock signal (Q_75) 415 and 75%-duty-cycled inverted quadrature-phase quadrature clock signal (QB_75) 435. Sharing a component also reduces parasitic capacitance. And because this circuitry can eliminate the need for some input components, parasitic capacitance is reduced even further using this circuitry. The reduction in parasitic capacitance causes clock edges to rise and fall faster, reducing jitter caused by noise, and reducing phase error caused by device mismatch. In addition, power consumption is reduced as compared to some of the known techniques described above, because, e.g., of the absence of increased clock loading or shift registers.

The circuits described in connection with FIGS. 1-4 may be thought of as using the first 50%-duty-cycled in-phase quadrature clock component, the first 50%-duty-cycled inverted in-phase quadrature clock component, the first 50%-duty-cycled quadrature-phase quadrature clock component and the first 50%-duty-cycled inverted quadrature-phase quadrature clock component, as respective selection signals to select the output 25%- (or 75%-) duty-cycled quadrature-phase quadrature clock component, the output 25%- (or 75%-) duty-cycled inverted quadrature-phase quadrature clock component, the output 25%- (or 75%-) duty-cycled in-phase quadrature clock component and the output 25%- (or 75%-) duty-cycled inverted in-phase quadrature clock component, from the undivided clock and the inverted undivided clock. In order to make sure that each selection signal is selecting the correct state of the undivided clock signal or the undivided inverted clock signal, delays 260, 460 may optionally be included on the 50%-duty-cycled quadrature clock component signals output by divide-by-2 circuits 111, 311, so that no signal is selected during a rising or falling edge of that signal. Delays 260, 460 may have values of up to one-quarter of an undivided input clock period. In an implementation of the subject matter of this disclosure, those values are set to one-quarter of a clock period.

As noted above, input components of previously-known circuits are not present in the circuits described in connection with FIGS. 1-4, reducing parasitic capacitance. In the circuits described in connection with FIGS. 1-4, the undivided input clocks (CK, CKB) are passed by the divide-by-2 circuit during half of its phase (logic '0' for a 25%-duty-cycle circuit as input to gate of a p-channel device and logic '1' for a 75%-duty-cycle circuit as input to the gate of an n-channel device). During the other half of the input clock phase, the input transistor is switched OFF where the output does not need to change. Therefore, depending on the input undivided clock, the output node can be floating. For example, for 25%-duty-cycle resync circuit 121, the output I_25 is floating when CK=0 and Q=1. Because the output node is floating in some portion of the clock cycle, the node dynamically holds the previous logical result. At lower frequencies (e.g., below 10 MHz), the output node may charge or discharge because of leakage current. However, leakage current has much less effect at higher frequencies (e.g., in the tens of MHz).

Figure 5:
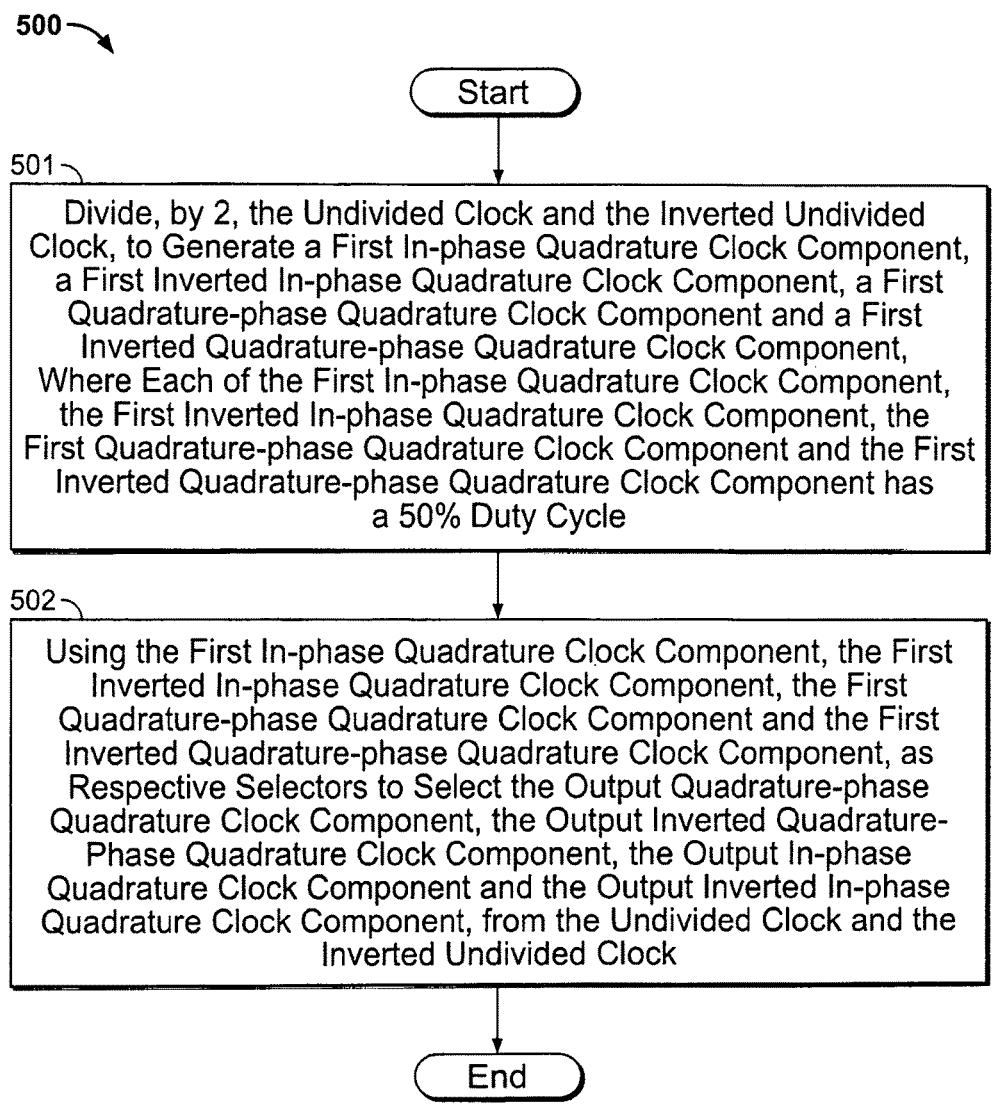
FIG. 5 is a flow diagram of a representative method according to implementations of the subject matter of this disclosure.

FIG. 5 is a flow diagram of a method 500, according to implementations of the subject matter of this disclosure, for generating an output quadrature-phase quadrature clock component, an output inverted quadrature-phase quadrature clock component, an output in-phase quadrature clock component and an output inverted in-phase quadrature clock component, from an undivided clock and an inverted undivided clock.

At 501, the undivided clock and the inverted undivided clock are divided by 2 to generate a first in-phase quadrature clock component, a first inverted in-phase quadrature clock component, a first quadrature-phase quadrature clock component and a first inverted quadrature-phase quadrature clock component. Each of the first in-phase quadrature clock component, the first inverted in-phase quadrature clock component, the first quadrature-phase quadrature clock component and the first inverted quadrature-phase quadrature clock component (collectively, the "first quadrature clock components") has a 50% duty cycle.

Next, at 502, the first quadrature clock components are used as selectors to select output quadrature clock components from the undivided clock and the inverted undivided clock. Specifically, in this implementation the first in-phase quadrature clock component, the first inverted in-phase quadrature clock component, the first quadrature-phase quadrature clock component and the first inverted quadrature-phase quadrature clock component, are used as respective selectors to select the output quadrature-phase quadrature clock component, the output inverted quadrature-phase quadrature clock component, the output in-phase quadrature clock component and the output inverted in-phase quadrature clock component, from the undivided clock and the inverted undivided clock, and method 500 ends.

Figure 6:
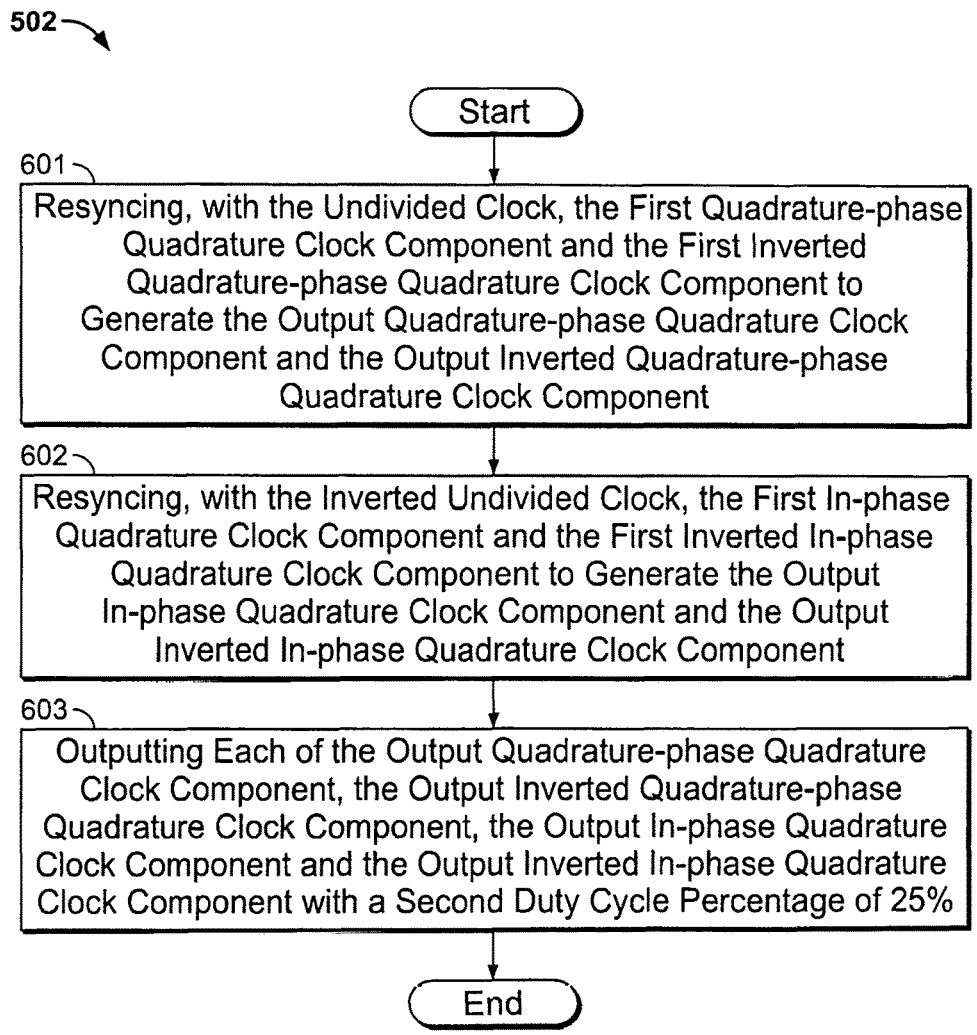
FIG. 6 is a flow diagram of a representative implementation of portions of FIG. 5.

FIG. 6 is a flow diagram of an implementation of the operations at 502. At 601, the undivided clock, the first quadrature-phase quadrature clock component and the first inverted quadrature-phase quadrature clock component are resynced to generate the output quadrature-phase quadrature clock component and the output inverted quadrature-phase quadrature clock component.

Next, at 602, the inverted undivided clock, the first in-phase quadrature clock component and the first inverted in-phase quadrature clock component are resynced to generate the output in-phase quadrature clock component and the output inverted in-phase quadrature clock component. At 603, each of the output quadrature-phase quadrature clock component, the output inverted quadrature-phase quadrature clock component, the output in-phase quadrature clock component and the output inverted in-phase quadrature clock component are output with a second duty cycle percentage of 25%.

As noted above, the resyncing includes coupling signal paths either by including one or more components in more than one signal path, or by gating two or more components with the same signal, or both.

Thus it is seen that methods and circuits for generating a 25%- or 75%-duty-cycled quadrature clock have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A quadrature clock divider circuit, comprising:
   a divide-by-2 circuit having at least one undivided clock input signal, the divide-by-2 circuit generating, from the at least one undivided clock input signal, at least one quadrature clock component and at least one inverted quadrature clock component, wherein each of the at least one quadrature clock component and the at least one inverted quadrature clock component has a 50% duty cycle; and a resync circuit having as inputs the at least one undivided clock input signal, the at least one quadrature clock component and the at least one inverted quadrature clock component, the resync circuit using the at least one quadrature clock component and the at least one inverted quadrature clock component as selectors to generate, from the at least one undivided clock input signal, at least one second quadrature clock component on a first signal path and at least one second inverted quadrature clock component on a second signal path; wherein:

the first signal path and the second signal path comprise respective first and second pluralities of transistors and have a first transistor in common; and each of the at least one second quadrature clock component and the at least one second inverted quadrature clock component has a second duty cycle percentage other than 50%.

2. The quadrature clock divider circuit of claim 1 wherein:
the at least one undivided clock input signal that is input to the divide-by-2 circuit comprises an undivided clock and an inverted undivided clock;

the at least one quadrature clock component and the at least one inverted quadrature clock component generated by the divide-by-2 circuit comprise a first in-phase quadrature clock component, a first inverted in-phase quadrature clock component, a first quadrature-phase quadrature clock component and a first inverted quadrature-phase quadrature clock component;

each of the first in-phase quadrature clock component, the first inverted in-phase quadrature clock component, the first quadrature-phase quadrature clock component and the first inverted quadrature-phase quadrature clock component has a 50% duty cycle;

the resync circuit has as inputs the undivided clock, the inverted undivided clock, the first in-phase quadrature clock component, the first inverted in-phase quadrature clock component, the first quadrature-phase quadrature clock component and the first inverted quadrature-phase quadrature clock component, the resync circuit generating, from the undivided clock and one of (a) the first quadrature-phase quadrature clock component and the first inverted quadrature-phase quadrature clock component, and (b) the first in-phase quadrature clock component and the first inverted in-phase quadrature clock component, a third quadrature clock component on the first signal path and a third inverted quadrature clock component on the second signal path;

the resync circuit further generates, from the inverted undivided clock and one of (a) the first in-phase quadrature clock component and the first inverted in-phase quadrature clock component, and (b) the first quadrature-phase quadrature clock component and the first inverted quadrature-phase quadrature clock component, a fourth quadrature clock component on a third signal path and a fourth inverted quadrature clock component on a fourth signal path; wherein:

the third signal path and the fourth signal path comprise respective third and fourth pluralities of transistors and have a second transistor in common; and each of the third quadrature clock component, the third inverted quadrature clock component, the fourth quadrature clock component and the fourth inverted quadrature clock has a second duty cycle percentage other than 50%.

3. The quadrature clock divider circuit of claim 2 wherein:
the first signal path is coupled to the second signal path; and
the third signal path is coupled to the fourth signal path.

4. The quadrature clock divider circuit of claim 3 wherein:
the first signal path comprises the first plurality of transistors;
the second signal path comprises the second plurality of transistors;
the first transistor is common to the first signal path and the second signal path;
the third signal path comprises the third plurality of transistors;
the fourth signal path comprises the fourth plurality of transistors; and
the second transistor is common to the third signal path and the fourth signal path.

5. The quadrature clock divider circuit of claim 4 wherein:
a respective transistor in the first signal path and a respective transistor in the second signal path share a first common gate input; and
a respective transistor in the third signal path and a respective transistor in the fourth signal path share a second common gate input.

6. The quadrature clock divider circuit of claim 5 wherein:
the first common gate input is also a gate input to the first transistor; and
the second common gate input is also a gate input to the second transistor.

7. The quadrature clock divider circuit of claim 6 wherein:
the first common gate input is the undivided clock; and
the second common gate input is the inverted undivided clock.

8. The quadrature clock divider circuit of claim 7 wherein:
the first transistor and the second transistor are both of a first channel type; and
all four of the respective transistor in the first signal path and the respective transistor in the second signal path that share the first common gate input, and the respective transistor in the third signal path and the respective transistor in the fourth signal path that share a second common gate input, are of a second channel type different from the first channel type, each respective transistor having a respective source and a respective drain;

the quadrature clock divider circuit further comprising:
a first input transistor in the first signal path gated by the first quadrature-phase quadrature clock component;
a second input transistor in the second signal path gated by the inverted first quadrature-phase quadrature clock component;
a third input transistor in the third signal path gated by the first in-phase quadrature clock component; and
a fourth input transistor in the fourth signal path gated by the inverted first in-phase quadrature clock component; wherein:
each of the first input transistor, the second input transistor, the third input transistor and the fourth input transistor is of the first channel type.

9. The quadrature clock divider circuit of claim 8 wherein:
the first channel type is p-channel;
the second channel type is n-channel;

each of the first transistor and the second transistor has a respective source coupled to a respective supply of voltage, and has a respective drain;
the first input transistor has a source coupled to the drain of the first transistor, and has a first drain;
the second input transistor has a source coupled to the drain of the first transistor, and has a second drain;
the first drain is coupled to the source of the respective transistor in the first signal path;
the second drain is coupled to the source of the respective transistor in the second signal path;
the third input transistor has a third drain that is coupled to the source of the respective transistor in the third signal path;
the fourth input transistor has a fourth drain that is coupled to the source of the respective transistor in the fourth signal path;
the respective drains of the respective transistors in the first, second, third and fourth signal paths are coupled to ground; and
the second duty-cycle percentage is 25%.

10. The quadrature clock divider circuit of claim 8 wherein:
the first channel type is n-channel;
the second channel type is p-channel;
each of the first transistor and the second transistor has a respective drain coupled to ground, and has a respective source;
the first input transistor has a drain coupled to the source of the first transistor, and has a first source;
the second input transistor has a drain coupled to the source of the first transistor, and has a second source;
the first source is coupled to the drain of the respective transistor in the first signal path;
the second source is coupled to the drain of the respective transistor in the second signal path;
the third input transistor has a third source that is coupled to the drain of the respective transistor in the third signal path;
the fourth input transistor has a fourth source that is coupled to the drain of the respective transistor in the fourth signal path;
the respective sources of the respective transistors in the first, second, third and fourth signal paths are coupled to a supply of voltage; and
the second duty-cycle percentage is 75%.

11. The quadrature clock divider circuit of claim 2, further comprising:
a respective time delay, between the divide-by-2 circuit and the resync circuit, on each of the first in-phase clock, the first inverted in-phase clock, the first quadrature clock and the first inverted quadrature clock to prevent edges of the first in-phase quadrature clock component, the first inverted in-phase quadrature clock component, the first quadrature-phase quadrature clock component and the first inverted quadrature-phase quadrature clock component from arriving simultaneously with edges of the undivided clock and the inverted undivided clock.

12. The quadrature clock divider circuit of claim 11, wherein each respective time delay is configured to have a delay value of up to one-quarter of a clock period.

13. The quadrature clock divider circuit of claim 12, wherein each respective time delay is configured to have a delay value of one-quarter of a clock period.

14. A method of generating an output quadrature-phase quadrature clock component, an output inverted quadrature-phase quadrature clock component, an output in-phase quadrature clock component and an output inverted in-phase quadrature clock component, from an undivided clock and an inverted undivided clock, the method comprising:
dividing, by 2, the undivided clock and the inverted undivided clock, to generate a first in-phase quadrature clock component, a first inverted in-phase quadrature clock component, a first quadrature-phase quadrature clock component and a first inverted quadrature-phase quadrature clock component, wherein each of the first in-phase quadrature clock component, the first inverted in-phase quadrature clock component, the first quadrature-phase quadrature clock component and the first inverted quadrature-phase quadrature clock component has a 50% duty cycle; and
using the first in-phase quadrature clock component, the first inverted in-phase quadrature clock component, the first quadrature-phase quadrature clock component and the first inverted quadrature-phase quadrature clock component, as respective selectors to select the output quadrature-phase quadrature clock component, the output inverted quadrature-phase quadrature clock component, the output in-phase quadrature clock component and the output inverted in-phase quadrature clock component, from the undivided clock and the inverted undivided clock on separate signal paths, the separate signal paths comprising respective first and second pluralities of transistors having a transistor in common.

15. The method of claim 14 wherein using the first in-phase quadrature clock component, the first inverted in-phase quadrature clock component, the first quadrature-phase quadrature clock component and the first inverted quadrature-phase quadrature clock component, as respective selectors to select the output quadrature-phase quadrature clock component, the output inverted quadrature-phase quadrature clock component, the output in-phase quadrature clock component and the output inverted in-phase quadrature clock component, from the undivided clock and the inverted undivided clock comprises:
resyncing the undivided clock with one of (a) the first quadrature-phase quadrature clock component and the first inverted quadrature-phase quadrature clock component, and (b) the first in-phase quadrature clock component and the first inverted in-phase quadrature clock component, to generate one of (1) the output in-phase quadrature clock component and the output inverted in-phase quadrature clock component, and (2) the output quadrature-phase quadrature clock component and the output inverted quadrature-phase quadrature clock component; and
resyncing the inverted undivided clock with one of (c) the first in-phase quadrature clock component and the first inverted in-phase quadrature clock component, and (d) the first quadrature-phase quadrature clock component and the first inverted quadrature-phase quadrature clock component, to generate one of (3) the output quadrature-phase quadrature clock component and the output inverted quadrature-phase quadrature clock component, and (4) the output in-phase quadrature clock component and the output inverted in-phase quadrature clock component; wherein:
each of the output quadrature-phase quadrature clock component, the output inverted quadrature-phase quadrature clock component, the output in-phase quadrature clock component and the output inverted in-phase quadrature clock component has a second duty cycle percentage other than 50%.

16. The method of claim 15 further comprising:
after the dividing and before the resyncings, delaying the first in-phase quadrature clock component, the first inverted in-phase quadrature clock component, the first quadrature-phase quadrature clock component and the first inverted quadrature-phase quadrature clock component, to prevent edges of the first in-phase quadrature clock component, the first inverted in-phase quadrature clock component, the first quadrature-phase quadrature clock component and the first inverted quadrature-phase quadrature clock component from arriving simultaneously with edges of the undivided clock and the inverted undivided clock.

17. The method of claim 16 wherein the delaying comprises delaying by up to one-quarter of a clock period.

18. The method of claim 15 wherein:
each of the output quadrature-phase quadrature clock component, the output inverted quadrature-phase quadrature clock component, the output in-phase quadrature clock component and the output inverted in-phase quadrature clock component is generated on its own respective signal path;
each of the respective resyncings comprises, respectively, coupling the signal path on which the output quadrature-phase quadrature clock component is generated to the signal path on which the output inverted quadrature-phase quadrature clock component is generated, and coupling the signal path on which the output in-phase quadrature clock component is generated to the signal path on which the output inverted in-phase quadrature clock component is generated.

19. The method of claim 15 wherein each of the respective resyncings comprises, respectively, generating the output quadrature-phase quadrature clock component and the output inverted quadrature-phase quadrature clock component having a second duty cycle of 25%, and generating the output in-phase quadrature clock component and the output inverted in-phase quadrature clock component having a second duty cycle of 25%.

20. The method of claim 15 wherein each of the respective resyncings comprises, respectively, generating the output quadrature-phase quadrature clock component and the output inverted quadrature-phase quadrature clock component having a second duty cycle of 75%, and generating the output in-phase quadrature clock component and the output inverted in-phase quadrature clock component having a second duty cycle of 75%.

* * * * *